(12) United States Patent
Gloor et al.

(10) Patent No.: US 11,982,529 B2
(45) Date of Patent: May 14, 2024

(54) METHOD FOR REGISTERING A TOTAL STATION IN THE REFERENCE SYSTEM OF A CAD MODEL

(71) Applicant: Hilti Aktiengesellschaft, Schaan (LI)

(72) Inventors: Thomas Gloor, Triesen (LI); Christoph Klug, Ernsthofen (AT); Clemens Arth, Gratwein-Strassengel (AT)

(73) Assignee: Hilti Aktiengesellschaft, Schaan (LI)

( * ) Notice: Subject to any disclaimer, the term of this patent is extended or adjusted under 35 U.S.C. 154(b) by 607 days.

(21) Appl. No.: 17/287,028

(22) PCT Filed: Oct. 16, 2019

(86) PCT No.: PCT/EP2019/078106
§ 371 (c)(1),
(2) Date: Apr. 20, 2021

(87) PCT Pub. No.: WO2020/083726
PCT Pub. Date: Apr. 30, 2020

(65) Prior Publication Data
US 2021/0381830 A1    Dec. 9, 2021

(30) Foreign Application Priority Data

Oct. 21, 2018  (EP) .................................... 18020521

(51) Int. Cl.
*G01C 15/00* (2006.01)
*G01C 15/06* (2006.01)
*G06F 30/13* (2020.01)

(52) U.S. Cl.
CPC .......... *G01C 15/006* (2013.01); *G01C 15/06* (2013.01); *G06F 30/13* (2020.01)

(58) Field of Classification Search
CPC .... G01C 15/006; G01C 15/06; G01C 15/004; G01C 15/002; G06F 30/13; G06F 30/12
USPC ....................................................... 356/4.01
See application file for complete search history.

(56) References Cited

U.S. PATENT DOCUMENTS

2013/0096873 A1    4/2013    Rosengaus et al.

OTHER PUBLICATIONS

PCT/EP2019/078106, International Search Report dated Dec. 16, 2019 (Two (2) pages).
Frederic Bosche, "Plane-based registration of construction laser scans with 3D/4D building models", *Advanced Engineering Informatics*, Amsterdam, vol. 26, No. 1, Aug. 24, 2011, pp. 90-102, XP028339511.

*Primary Examiner* — Daniel L Murphy
(74) *Attorney, Agent, or Firm* — Crowell & Moring LLP

(57) ABSTRACT

A method for registering a total station, which is deployed in a measurement environment with one or more objects, in the reference system of a computer-aided design (CAD) model, which images the one or more objects of the measurement environment, includes registering the total station by a control device.

4 Claims, 3 Drawing Sheets

METHOD FOR REGISTERING A TOTAL STATION IN THE REFERENCE SYSTEM OF A CAD MODEL

CROSS REFERENCE TO RELATED APPLICATIONS

This application claims the priority of International Application No. PCT/EP2019/078106, filed Oct. 16, 2019, and European Patent Document No. 18020521.3, filed Oct. 21, 2018, the disclosures of which are expressly incorporated by reference herein.

BACKGROUND AND SUMMARY OF THE INVENTION

The invention relates to a method for registering a total station in the reference system of a computer-aided design (CAD) model.

Total stations are surveying appliances, which comprise angle and distance measuring units and which permit angle and distance measurements to selected target objects. The angle and distance measured values are measured in the reference system of the total station and must still be linked to an external reference system for an absolute determination of position.

In known methods for registering a total station in an external reference system, target objects are positioned at known control points and the coordinates of the control points are measured in the reference system of the total station; moreover, the coordinates of the control points are known in the external reference system. The total station is registered with the aid of the coordinates of the control points in the external reference system and in the reference system of the total station.

The object of the present invention consists of simplifying the registration of a total system in the reference system of a CAD model, to the effect of allowing the registration of the total station without control points with known coordinates.

According to the invention, the method for registering a total station, which is deployed in a measurement environment with one or more objects, in the reference system of a CAD model, which images the objects of the measurement environment, by means of a control device includes the following steps:

selecting three surfaces in the CAD model, wherein the normal vectors of the three surfaces span a three-dimensional space, determining a first plane equation for a first plane, which comprises a first surface of the three surfaces, a second plane equation for a second plane, which comprises a second surface of the three surfaces, and a third plane equation for a third plane, which comprises a third surface of the three surfaces, in the reference system of the CAD model by means of the control device, aligning the total station in the measurement environment on the point of intersection of the first, second and third plane in the CAD model, wherein the alignment of the total station is defined as start pose by the control device, rotating the total station about the axis of rotation of the start pose and carrying out N different measurements during the rotation of the total station, wherein, in each of the N different measurements, a horizontal angle is measured by a first angle measuring unit, a vertical angle is measured by a second angle measuring unit and a distance is measured by a distance measuring unit of the total station, storing N different measured points with measured coordinates, wherein the measured coordinates comprise the horizontal angle, the vertical angle and the distance, assigning K of the N, K≤N, different measured points to the first plane, to the second plane or to the third plane, wherein the measured points assigned to the first plane are defined as first measured points, the measured points assigned to the second plane are defined as second measured points and the measured points assigned to the third plane are defined as third measured points, in each case by the control device, determining a first function equation for the first measured points, a second function equation for the second measured points and a third function equation for the third measured points in the reference system of the total station by means of the control device, determining a mapping between the first, second and third plane equation in the reference system of the CAD model and the first, second and third function equation in the reference system of the total station by means of the control device, and storing the mapping as a transformation function between the reference system of the total station and the reference system of the CAD model.

The total station is registered in the reference system of the CAD model without control points. In the CAD model, the operator selects three surfaces, which are non-parallel and the associated planes of which intersect at a point of intersection. The selection of the three non-parallel surfaces in the CAD model can also be implemented by selecting a corner or any other structure that has three non-parallel surfaces. The operator aligns the total station in a start position and start orientation (start pose), in which the distance measuring unit of the total station is aligned on the point of intersection of the three planes. An exact alignment of the total station is not required since the point of intersection itself is not measured.

The reference system of the total station is linked to the reference system of the CAD model not by way of control points and two distributions but by way of two sets of plane equations. The plane equations in the reference system of the CAD model can be derived from the CAD model by the control device with little outlay and the plane equations in the reference system total station are determined with the aid of the measured points. Aligning the total station on the point of intersection of the three planes and subsequently rotating the total station about this axis of rotation ensures that measured points are generated for each of the three planes and that corresponding plane equations can be determined in the reference system of the total station with the aid of the measured points.

The control device determines a mapping between the reference system of the total station and the reference system of the CAD model from the plane equations in the reference system of the CAD model and the function equations in the reference system of the total station with the aid of known mathematical or numerical methods, and stores this mapping as a transformation function. The transformation function between the reference system of the total station and the reference system of the CAD model can be used for various coordinate transformations between the reference systems.

In a first preferred variant, the position and/or the orientation of the total station are determined in the reference system of the CAD model. The position and/or the orientation of the total station can be transformed into the reference system of the CAD model with the aid of the transformation function and the pose (position and orientation) of the total station is known in the reference system of the CAD model.

In a second preferred variant, measured coordinates, which were measured with the total station in the reference system of the total station, are transformed into the reference system of the CAD model. The transformation function between the reference system of the total station and the reference system of the CAD model can be used to transfer measured coordinates into the CAD model.

In a third preferred variant, intended coordinates, which were determined in the reference system of the CAD model, are transformed into the reference system of the total station. The transformation function between the reference system of the total station and the reference system of the CAD model can be used to transfer intended coordinates from the CAD model into the measurement environment. For layout purposes, coordinates are transferred from a plan (CAD model) into the measurement environment. The intended coordinates can be converted into angle coordinates and distance coordinates for the total station with the aid of the transformation function. The operator uses a reflecting target object and is assisted by the total station in finding the coordinates in the measurement environment.

Exemplary embodiments of the invention are described hereinafter with reference to the drawings. It is not necessarily intended for these to illustrate the exemplary embodiments to scale; instead, the drawings, where conducive to elucidation, is executed in schematic and/or slightly distorted form. It should be taken into account here that various modifications and alterations relating to the form and detail of an embodiment may be undertaken without departing from the general concept of the invention. The general concept of the invention is not limited to the exact form or the detail of the preferred embodiment shown and described hereinafter or limited to subject matter that would be limited compared to the subject matter claimed in the claims. For given design ranges, values within the limits mentioned shall also be disclosed as limiting values and shall be usable and claimable as desired. For the sake of simplicity, identical reference numerals are used hereinafter for identical or similar parts or parts having identical or similar function.

DETAILED DESCRIPTION OF THE DRAWINGS

Figure 1:
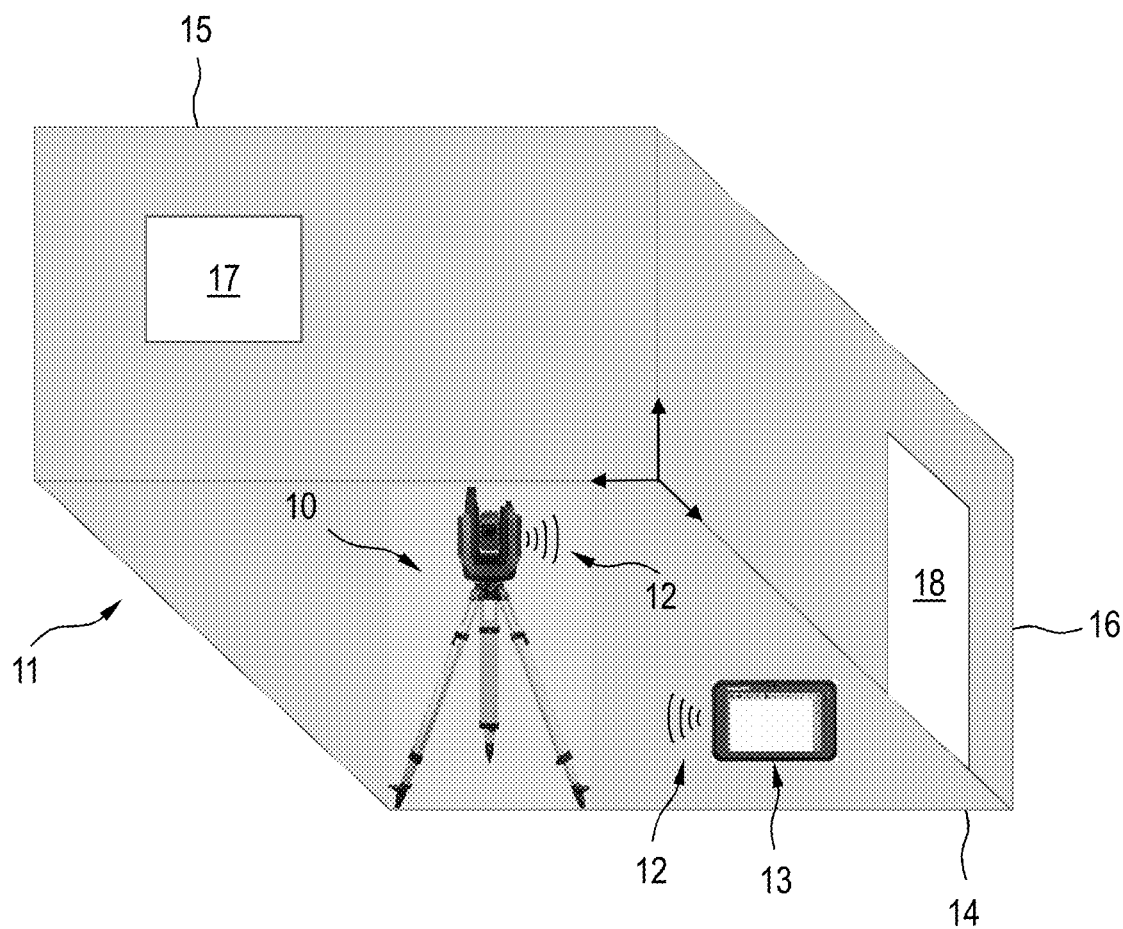
FIG. 1 shows a total station, which is deployed in a measurement environment and linked to a control device.

FIG. 1 shows a total station 10, which is deployed in a measurement environment 11 and which is connected to a control device 13 via a communications link 12. The measurement environment 11 is embodied as an interior in the exemplary embodiment, the interior being bounded by a floor surface 14, a back wall 15 and a side wall 16; the further boundary surfaces of the measurement environment 11 are not illustrated.

The measurement environment 11 comprises a plurality of objects. The objects in the measurement environment 11 include the floor surface 14, the back wall 15 and the side wall 16, as well as a window cutout 17 and a door cutout 18. The objects 14, 15, 16, 17, 18 in the measurement environment are imaged in a CAD model.

Figure 2A:
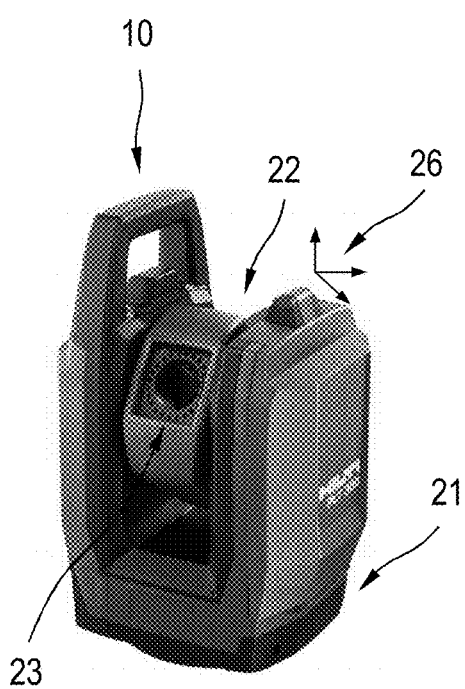
FIGS. 2A, 2B show the total station (FIG. 2A) and the control device with a CAD model (FIG. 2B) in detail.
Figure 2B:
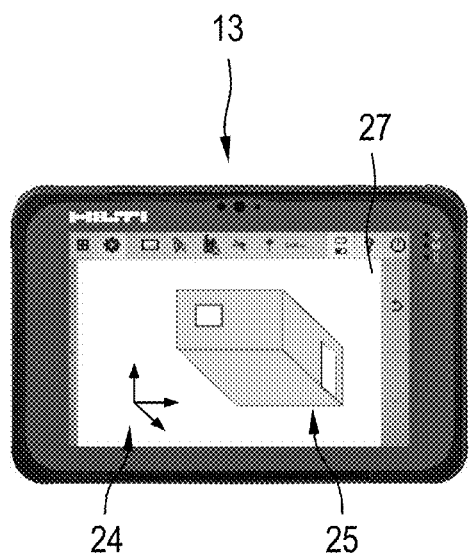

FIGS. 2A, 2B show the total station 10 (FIG. 2A) and the control device 13 (FIG. 2B) of FIG. 1 in detail. The total station 10 and the control device 13 are connected to one another by way of the communications link 12.

The total station 10 comprises a first angle measuring unit 21, which measures a horizontal angle, a second measuring angle unit 22, which measures a vertical angle, and a distance measuring unit 23, which measures a distance. In order to be able to use the total station 10 for layout purposes, the total station 10 must be registered in the reference system 24 of the CAD model 25; i.e., the transformation function between the reference system 26 of the total station 10 and the reference system 24 of the CAD model 25 must be determined.

Figure 3A:
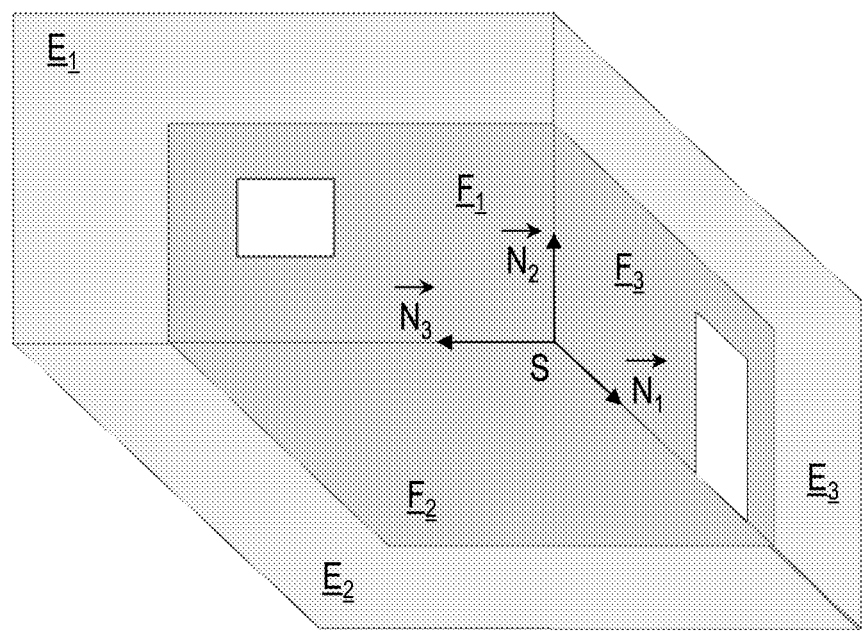
FIGS. 3A, 3B show the CAD model of the objects (FIG. 3A) and the measurement environment 11 with the total station 10.
Figure 3B:
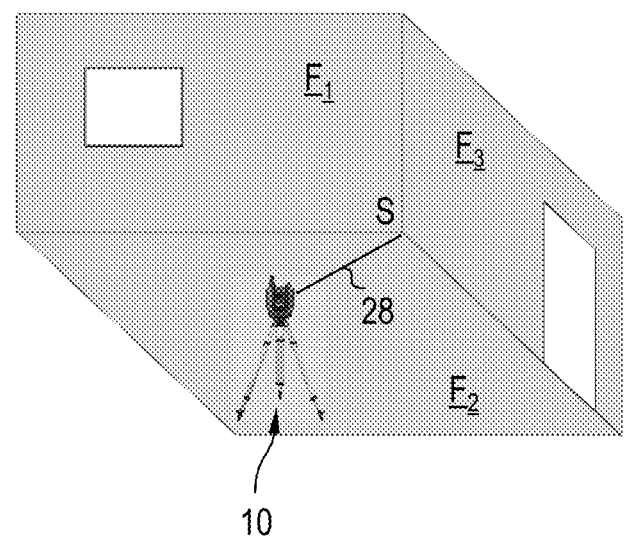

Carrying out the method according to the invention for registering the total station 10 in the reference system 24 of the CAD model 25 is controlled by the control device 13. The CAD model 25 of the objects is loaded into the control device 13 and displayed on a display 27 of the control device 13. FIGS. 3A, 3B show the CAD model 25 of the objects (FIG. 3A) and the measurement environment 11 with the total station 10 (FIG. 3B).

The operator selects three surfaces in the CAD model 25 and marks the surfaces. In the exemplary embodiment, the surface of the back wall of 15 forms a first surface $F_1$, the surface of the floor surface 14 forms a second surface $F_2$ and the surface of the side wall 16 forms a third surface $F_3$. It is essential to the method according to the invention that the three surfaces $F_1$, $F_2$, $F_3$ are disposed in non-parallel fashion with respect to one another. Mathematically, this condition is taken into account by virtue of the normal vectors of the three surfaces $F_1$, $F_2$, $F_3$ spanning a three-dimensional space. The first surface $F_1$ is characterized by a first normal vector $\vec{N}_1$, which is perpendicular to the first surface $F_1$, the second surface $F_2$ is characterized by a second normal vector $\vec{N}_2$, which is perpendicular to the second surface $F_2$, and the third surface $F_3$ is characterized by a third normal vector $\vec{N}_3$, which is perpendicular to the third surface $F_3$.

The control device 13 determines a first plane $E_1$, which comprises the first surface $F_1$, a second plane $E_2$, which comprises the second surface $F_2$, and a third plane $E_3$, which comprises the third surface $F_3$. The position and orientation of a plane in three-dimensional space is uniquely determined by a point and the specification of the normal vector. Alternatively, the position and orientation of a plane can be set by three points, for example. The control device 13 generates a first plane equation for the first plane $E_1$, a second plane equation for the second plane $E_2$ and a third plane equation for the third plane $E_3$.

In order to register the total station 10 in the reference system of the CAD model with the aid of the method according to the invention, the total station 10 in the measurement environment 11 is aligned on the point of intersection S of the first, second and third plane $E_1$, $E_2$, $E_3$ in the CAD model (FIG. 3B). This alignment of the total station 10 is defined as start pose by the control device 13. The start pose comprises a start position and start orientation. The total station 10 rotates about the start orientation of the start pose as an axis of rotation 28 and carries out N, N∈

$\mathbb{N}$, different measurements during the rotation. During each measurement, a horizontal angle is measured by the first angle measuring unit 21, a vertical angle is measured by the second angle measuring unit 22 and a distance is measured by the distance measuring unit 23. In the exemplary embodiment, a total of N=19 different measurements are carried out during the rotation of the total station 10.

Figure 4:
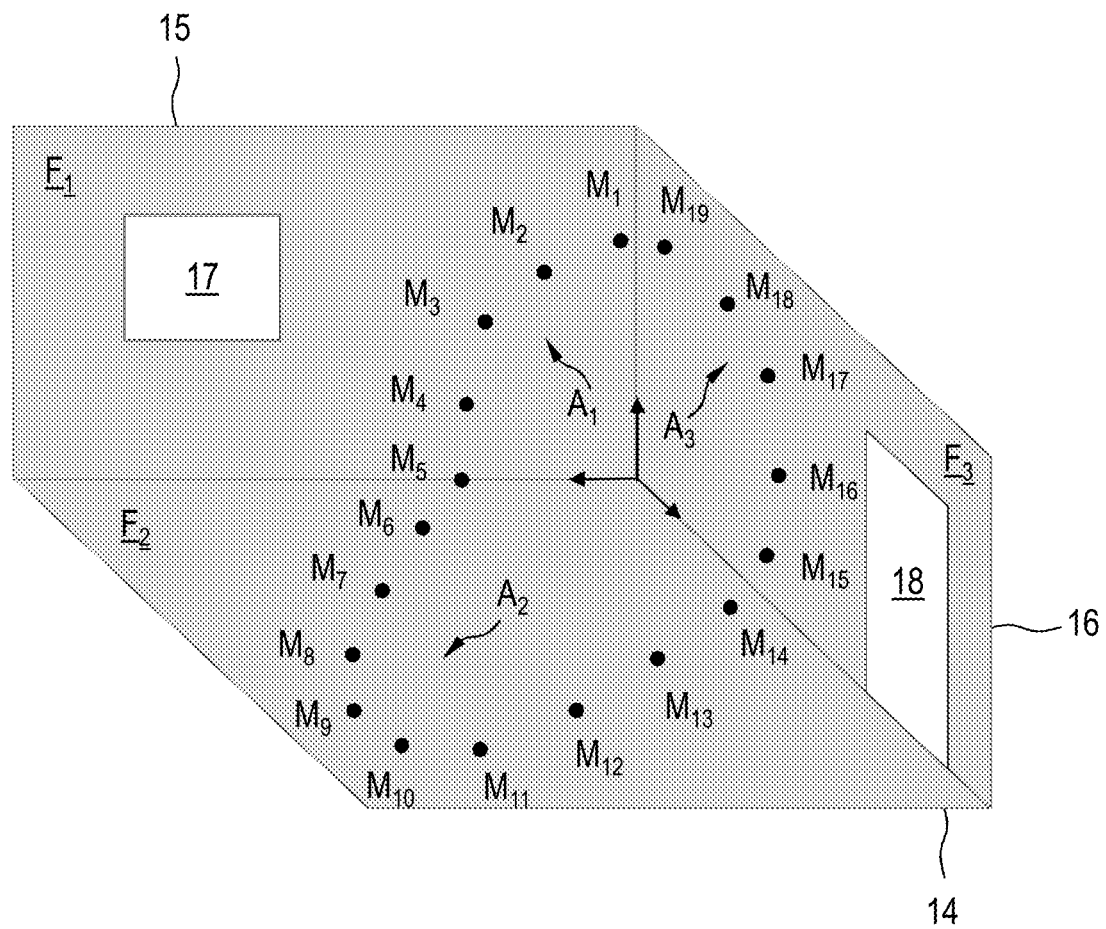
FIG. 4 shows the measurement environment with N measured points.

FIG. 4 shows the N=19 different measurements. For each measurement, a measured point $M_i$, $i \in \mathbb{N}$, with associated measured coordinates is defined, wherein the measured coordinates each comprise a horizontal angle, a vertical angle and a distance. In the next step, the measured points $M_i$ are assigned to the first plane $E_1$, the second plane $E_2$ or the third plane $E_3$ by the control device 13. The measured points $M_1$ to $M_4$ are assigned to the first plane $E_1$ and defined as first measured points $A_1$, the measured points $M_6$ to $M_{14}$ are assigned to the second plane $E_2$ and defined as second measured points $A_2$ and the measured points $M_{15}$ to $M_{19}$ are assigned to the third plane $E_3$ and defined as third measured points $A_3$. The measured point $M_5$ lies on the line of intersection between the first plane $E_1$ and the second plane $E_2$ and cannot be uniquely assigned to either the first plane $E_1$ or the second plane $E_2$.

Following the assignment of the measured points $M_i$ to the first, second or third plane, the control device 13 determines a first function equation for a first plane in the reference system 26 of the total station 10 from the first measured points $A_1$, a second function equation for a second plane in the reference system 26 of the total station 10 from the second measured points $A_2$ and a third function equation for a third plane in the reference system 26 of the total station 10 from the third measurement points $A_3$. The accuracy with which the control device 13 can determine the function equations (first, second and third function equation) in the reference system 26 of the total station 10 depends on the number of respective measured points $M_i$ and the accuracy with which the measured points $M_i$ were determined.

First, second and third plane equations in the reference system 24 of the CAD model 25 and first, second and third function equations in the reference system 26 of the total station 10 are stored for the first, second and third plane in the control device 13. The control device 13 determines a mapping between the reference system 26 of the total station 10 and the reference system 24 of the CAD model 25 from the plane equations in the reference system 24 of the CAD model 25 and the function equations in the reference system 26 of the total station 10 with the aid of known mathematical or numerical methods, and stores this mapping as a transformation function.

The transformation function between the reference system 26 of the total station 10 and the reference system 24 of the CAD model 25 can be used for various coordinate transformations between the reference systems 24, 26. By way of example, measured coordinates, which were measured with the total station 10 in the reference system 26 of the total station 10, can be transformed into the reference system 24 of the CAD model 25, or intended coordinates, which were determined in the reference system 24 of the CAD model 25, can be transformed into the reference system 26 of the total station 10.

The invention claimed is:

1. A method for registering a total station (10), which is deployed in a measurement environment (11) with one or more objects (14, 15, 16, 17, 18), in a reference system (24) of a computer-aided design (CAD) model (25), which images the one or more objects (14, 15, 16, 17, 18) of the measurement environment (11), by a control device (13), comprising the steps of:

selecting three surfaces ($F_1$, $F_2$, $F_3$) in the CAD model (25), wherein respective normal vectors ($\vec{N_1}$, $\vec{N_2}$, $\vec{N_3}$) of the three surfaces ($F_1$, $F_2$, $F_3$) span a three-dimensional space;

determining a first plane equation for a first plane ($E_1$), which comprises a first surface ($F_1$) of the three surfaces ($F_1$, $F_2$, $F_3$), a second plane equation for a second plane ($E_2$), which comprises a second surface ($F_2$) of the three surfaces ($F_1$, $F_2$, $F_3$), and a third plane equation for a third plane ($E_3$), which comprises a third surface ($F_3$) of the three surfaces ($F_1$, $F_2$, $F_3$), in the reference system (24) of the CAD model (25) by the control device (13);

aligning the total station (10) in the measurement environment (11) on a point of intersection (S) of the first plane ($E_1$), second plane ($E_2$) and third plane ($E_3$) in the CAD model (25), wherein the alignment of the total station (10) is defined as a start pose by the control device (13);

rotating the total station (10) about an axis of rotation (28) of the start pose and carrying out N, $N \in \mathbb{N}$, different measurements during the rotation of the total station (10), wherein, in each of the N different measurements, a horizontal angle is measured by a first angle measuring unit (21), a vertical angle is measured by a second angle measuring unit (22) and a distance is measured by a distance measuring unit (23) of the total station (10);

storing N different measured points ($M_1$-$M_{19}$) with measured coordinates, wherein the measured coordinates comprise the horizontal angle, the vertical angle and the distance;

assigning K of the N, $K \leq N$, different measured points to the first plane ($E_1$), to the second plane ($E_2$) or to the third plane ($E_3$), wherein measured points assigned to the first plane ($E_1$) are defined as first measured points ($A_1$), measured points assigned to the second plane ($E_2$) are defined as second measured points ($A_2$) and measured points assigned to the third plane ($E_3$) are defined as third measured points ($A_3$) by the control device (13);

determining a first function equation for the first measured points ($A_1$), a second function equation for the second measured points ($A_2$) and a third function equation for the third measured points ($A_3$) in the reference system (26) of the total station (10) by the control device (13);

determining a mapping between the first, the second and the third plane equations in the reference system (24) of the CAD model (25) and the first, the second and the third function equations in the reference system (26) of the total station (10) by the control device (13); and storing the mapping as a transformation function between the reference system (26) of the total station (10) and the reference system (24) of the CAD model (25).

2. The method as claimed in claim 1, wherein a position and/or an orientation of the total station (10) are determined in the reference system (24) of the CAD model (25).

3. The method as claimed in claim 1, wherein measured coordinates, which are measured with the total station in the reference system (26) of the total station (10), are transformed into the reference system (24) of the CAD model (25).

4. The method as claimed in claim 1, wherein intended coordinates, which are determined in the reference system (24) of the CAD model (25), are transformed into the reference system (26) of the total station (10).

\* \* \* \* \*